(12) United States Patent
Maeda

(10) Patent No.: US 7,813,144 B2
(45) Date of Patent: Oct. 12, 2010

(54) CONTROL APPARATUS

(75) Inventor: Takashi Maeda, Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 449 days.

(21) Appl. No.: 11/911,935

(22) PCT Filed: Apr. 10, 2006

(86) PCT No.: PCT/JP2006/307562

§ 371 (c)(1),
(2), (4) Date: Oct. 18, 2007

(87) PCT Pub. No.: WO2006/115028

PCT Pub. Date: Nov. 2, 2006

(65) Prior Publication Data

US 2009/0059547 A1 Mar. 5, 2009

(30) Foreign Application Priority Data

Apr. 19, 2005 (JP) .............................. 2005-120513

(51) Int. Cl.
*H05K 7/14* (2006.01)
(52) U.S. Cl. ...................... 361/809; 361/742; 361/758; 361/770; 361/804
(58) Field of Classification Search ................. 361/742, 361/770, 758, 807, 809
See application file for complete search history.

(56) References Cited

U.S. PATENT DOCUMENTS 5,825,631 A * 10/1998 Prchal ........................ 361/790
7,432,702 B2 * 10/2008 Shiao et al. ............... 324/158.1

FOREIGN PATENT DOCUMENTS

| JP | 57-108386 | * | 7/1982 |
| JP | 57-108386 U | | 7/1982 |
| JP | 2-36085 U | | 3/1990 |
| JP | 06-021666 A | | 1/1994 |

* cited by examiner

*Primary Examiner*—Dameon E Levi
(74) *Attorney, Agent, or Firm*—Sughrue Mion, PLLC

(57) ABSTRACT

There is provided a control apparatus capable of simply supporting/fixing a board by a board support, reducing a number of integrating steps, reducing cost and downsizing a board size.

In a control apparatus constituted by attaching a board to a board support provided at a base attachably and detachably, the board support is constituted by a resin, and includes a guide having a section in an L-like shape provided at one side end portion of the board support, a hook having a section in an L-like shape provided at other side end portion of the board support, and a board mounting portion provided between the guide and the hook for supporting a lower face of the board. The guide includes an engaging portion engaged with one side end portion of the board mounted to the board mounting portion at an upper portion thereof. The hook includes an engaging portion engaged with other side end portion of the board mounted to the board mounting portion and provided with an elasticity, and the hook is constituted to be able to be inclined.

5 Claims, 3 Drawing Sheets

CONTROL APPARATUS

TECHNICAL FIELD

The present invention relates to a control apparatus of, for example, a servo amplifier, a servo drive, or an inverter apparatus or the like, particularly relates to a board support structure at an inside of a control apparatus.

BACKGROUND ART

According to a board support structure in a control apparatus of a background art, generally, a board is fixed by using a stud (for example, Patent Reference 1).

FIG. 3 is a top view of a board support structure of a background art, FIG. 4 is a front view of the board support structure of the background art.

In FIG. 3 and FIG. 4, notation 3A designates aboard support constituted by a metal stud which is fixed to a base (not illustrated) of a heat sink or the like. Notation 2A designates a board mounted at an upper portion of the metal stud 1A, numeral 19 designates a screw for fastening to fix the board 2A to the board support 3A.

When the board 2A is fixed onto the board support 3A, an operator optically positions a screw passing hole (not illustrated) of the board 2A to a position of a screw hole of the board support 3A, under the state, the screw 19 is screwed to the screw hole of the board support 3A by passing the screw passing hole of the board 2A.

Patent Reference 1: JP-A-06-021666

DISCLOSURE OF THE INVENTION

Problems that the Invention is to Solve

However, according to the background art, the board 2A is fixed by the screw 19. Therefore, there poses a problem that integrating steps are taken, cost is increased by a part of the board support 3A constituting the metal stud, the screw 19 or the like, and a size of the board 2A is enlarged in order to ensure an insulation distance by using a metal part and a region for attaching the screw.

The invention has been carried out in order to resolve the problem, and it is an object thereof to provide a control apparatus capable of simply supporting/fixing a board by a board support, reducing integrating steps, reducing cost, and reducing a board size.

Means for Solving the Problems

In order to resolve the above-described problem, aspects of the invention are constituted as follows.

According to a first aspect of the invention, in a control apparatus constituted by attaching a board to a board support provided at a fixed portion attachably and detachably, the board support is constituted by a resin and includes a guide having a section in an L-like shape provided at one side end portion of the support member, a hook having a section in an L-like shape provided at other side end portion of the board support, and a board mounting portion provided between the guide and the hook for supporting a lower face of the board. The guide includes an engaging portion engaged with one side end portion of the board mounted to the board mounting portion at an upper portion thereof. The hook includes an engaging portion engaged with other side end portion of the board mounted to the board mounting portion at an upper portion thereof. The hook is provided with an elasticity and can be inclined.

According to a second aspect of the invention, a portion of the hook raised from the board support is formed by a shape of a circular arc.

According to a third aspect of the invention, a front end of the engaging portion of the guide is formed with an inclined portion an upper portion side of which is projected, and a front end of the engaging portion of the hook is formed with an inclined portion a lower portion side of which is projected.

According to a fourth aspect of the invention, the board is provided with first positioning grooves by forming a plurality of pieces of notches at an end portion thereof on a side of being engaged with the guide to be engaged with positioning projected portions provided at the board support portion, and provided with a second positioning groove by forming a notch at an end portion of a portion thereof engaged with the hook to be engaged with the engaging portion of the hook provided at the board support portion.

According to a fifth aspect of the invention, the board support is formed with a positioning projection extended to an upper side and a positioning hole for fitting to insert the positioning projection is provided at a position of the board in correspondence with the positioning projection.

According to a sixth aspect of the invention, a front end of the positioning projection is formed by a conical shape or a curved face shape.

Advantage of the Invention

According to the aspects of the invention, the following effects are achieved.

(1) According to the first aspect of the invention, the board is supported by being only mounted to the board mounting portion by engaging the end portions of the board to the engaging portions of the guide and the hook of the board support without using a screw or the like as in the background art, and the board can be supported/fixed by the board support extremely simply. Therefore, there is achieved an effect of capable of reducing a cost by reducing a number of integrating steps and a number of members and capable of designing to downsize the board by shortening an insulation distance and space saving formation of a board attaching operation space.

(2) According to the second aspect of the invention, stress concentration is not brought about at the raised portion of the hook which is obliged to be inclined by the elasticity when the board is engaged therewith to be pressed to the engaging portion of the hook.

(3) According to the third aspect of the invention, the front end of the engaging portion of the guide is formed with the inclined portion the upper portion side of which is projected. Therefore, when the board is made to creep under the engaging portion, the board is easy to be inclined and the board is not damaged. Further, operation is easy to be carried out.

Further, the front end of the engaging portion of the hook is formed with the inclined portion the lower portion side of which is projected. Therefore, by only pressing the board to the inclined portion of the hook, the engaging portion of the hook can simply be widened and the operation can easily be carried out without damaging the board.

(4) According to the fourth aspect of the invention, the board is provided with the first and the second positioning grooves, the positioning projected portion of the board support portion and the engaging portion of the hook are engaged. Therefore, the board can firmly be positioned.

(5) According to the fifth aspect of the invention, by engaging the positioning hole of the board to the positioning projection of the board support, the board can further firmly be positioned.

(6) According to the sixth aspect of the invention, the front end of the positioning projection of the board support is formed in the conical shape or the curved face shape. Therefore, even in a sate of inclining the board, the front end of the positioning projection can simply be inserted into the positioning hole of the board, and the positioning operation can easily be carried out.

BRIEF DESCRIPTION OF THE DRAWINGS

FIG. 2A is a plane view, FIG. 2B is a sectional view taken along a line A-A of FIG. 2A, FIG. 2C is a sectional view taken along a line B-B thereof, FIG. 2D is a sectional view taken along a line C-C thereof.

Figure 1:
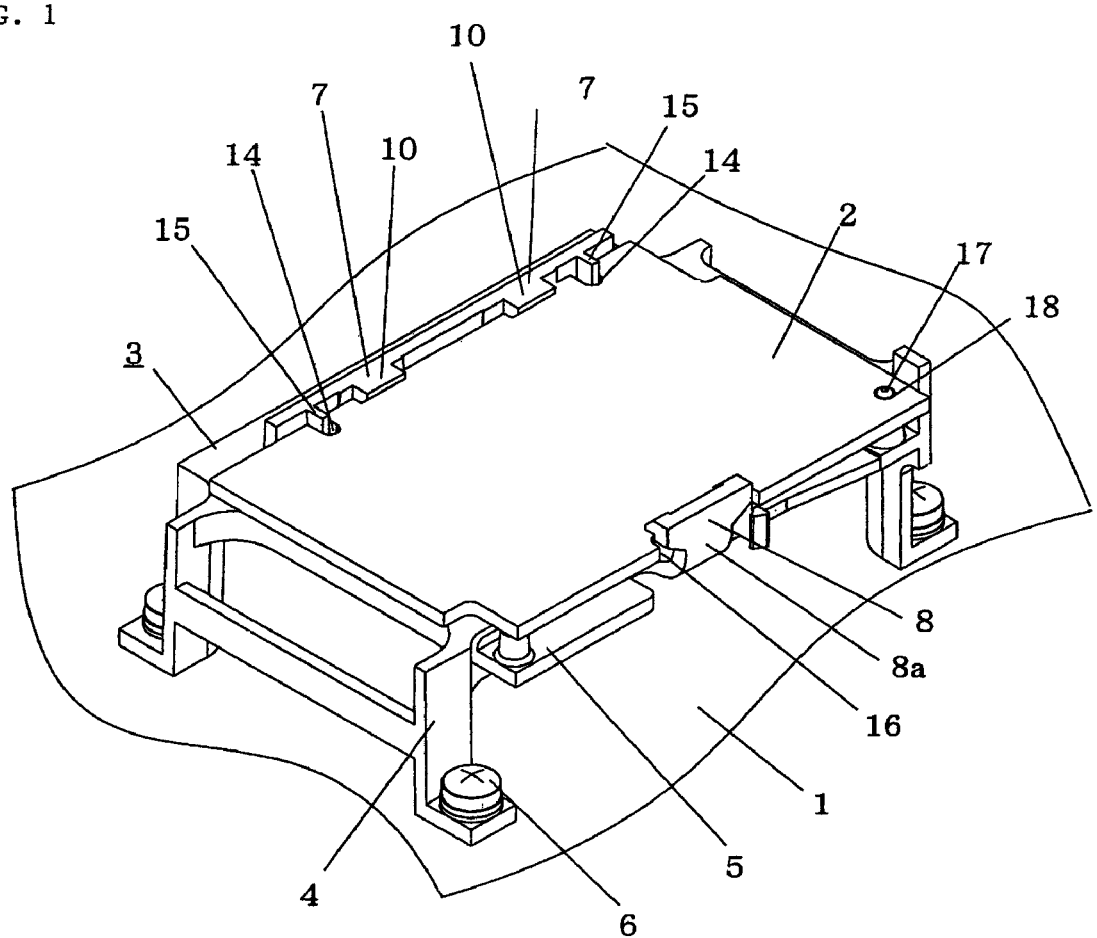
FIG. 1 is a perspective view showing a state of mounting a board to a board support of a control apparatus according to an embodiment of the invention.

DESCRIPTION OF REFERENCE NUMERALS AND SIGNS 1, 1A base
2, 2A board
3, 3A board support
4 leg portion
5 board support portion
6 bolt
7 guide
8 hook
8a raised portion
9 board mounting portion
10 engaging portion
11 engaging portion
12 inclined portion
13 inclined portion
14 first positioning groove
15 positioning projected portion
16 second positioning groove
17 positioning projection
18 positioning hole
19 screw

BEST MODE FOR CARRYING OUT THE INVENTION

An embodiment of the invention is explained in reference to the drawings as follows.

Embodiment 1

FIG. 1 is a perspective view showing a state of mounting a board to a board support of a control apparatus according to an embodiment of the invention.

Figure 2A:
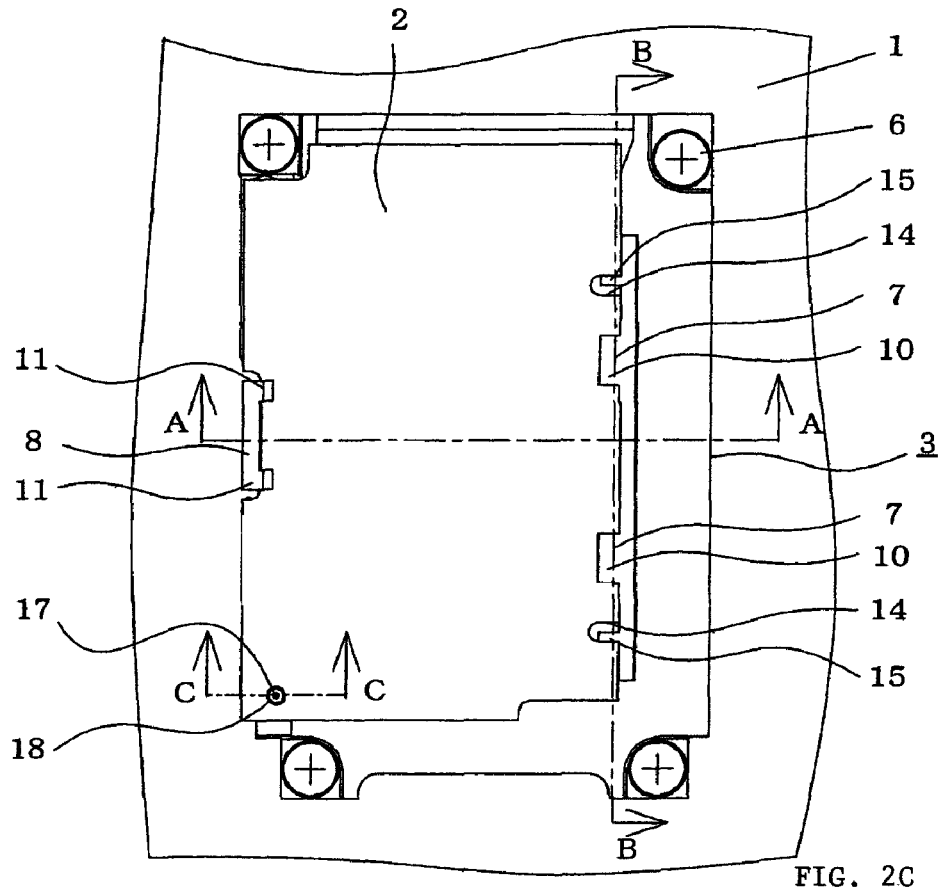
FIGS. 2A, 2B, 2C and 2D are a board support structure of FIG. 1.
Figure 2B:
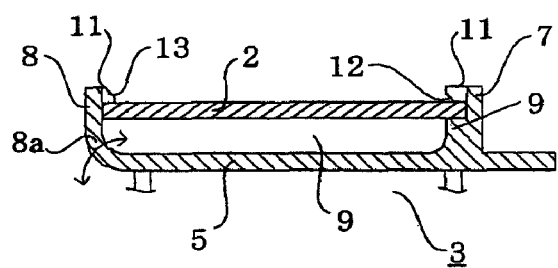
Figure 2D:
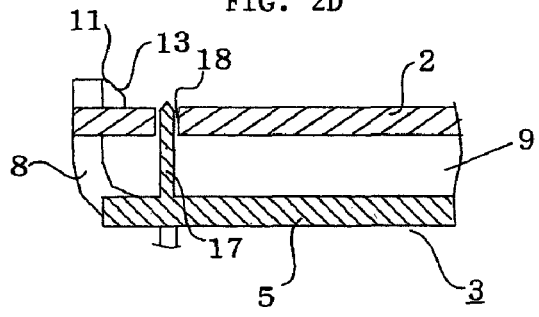
Figure 2C:
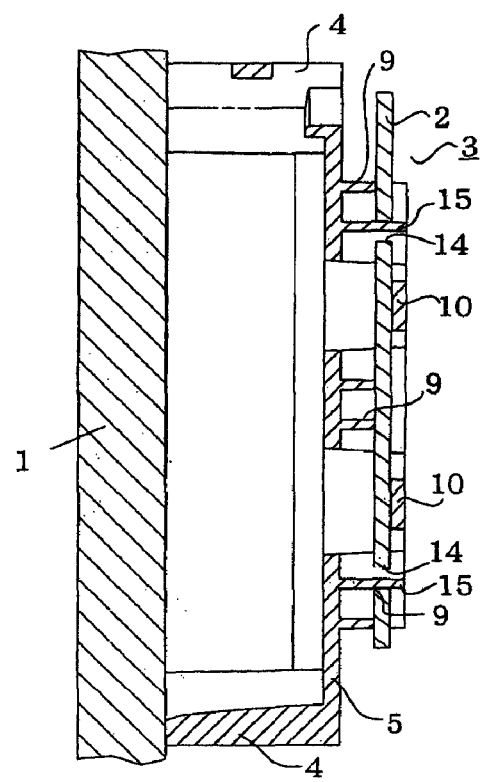
Figure 3:
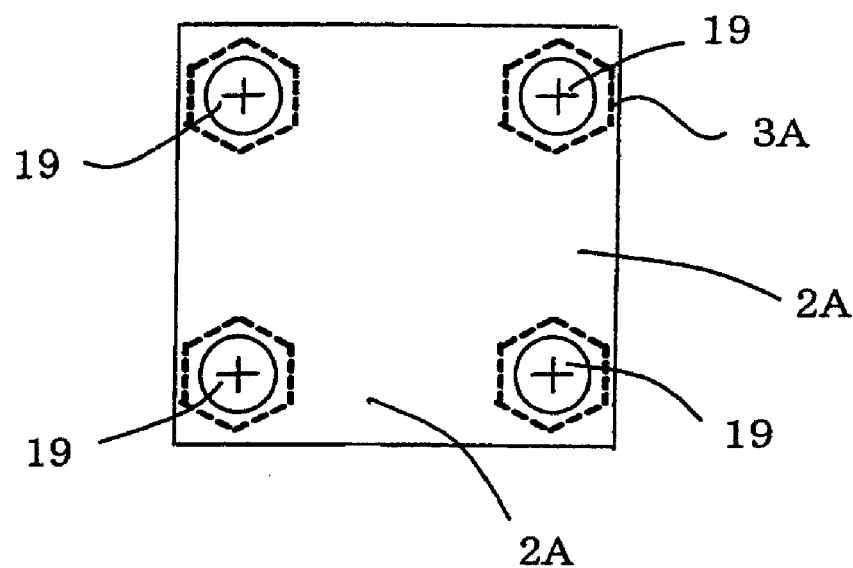
FIG. 3 is a plane view showing a board support structure of a background art.
Figure 4:
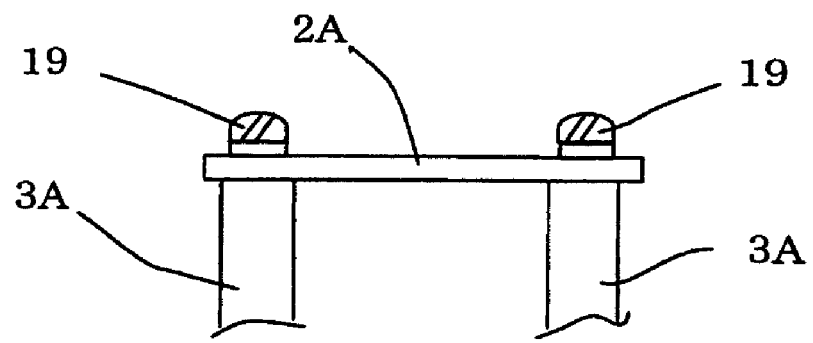
FIG. 4 is a front view of FIG. 3.

FIGS. 2A, 2B, 2C and 2D are drawings showing the board support structure of FIG. 1. FIG. 2A is a plane view, FIG. 2B is a sectional view taken along a line A-A of FIG. 2A, FIG. 2C is a sectional view taken along a line B-B thereof, FIG. 2D is a sectional view taken along a line C-C thereof.

In FIG. 1 and FIG. 2A, numeral 1 designates the base constituted by the heat sink or the like, numeral 2 designates the board support made of a resin for positioning to support to fix the board 3, which provides the leg portion 4 and the board support portion 5 constituted at an upper portion of the leg portion 4. The leg portions 4 are constituted by, for example, four pieces thereof and fastened to be fixed to the base 1 by bolts 6. The board support portion 5 is provided with the guide 7 having a section in an L-like shape to extend to an upper side at one side end portion thereof, and is provided with the hook 8 having a section in the L-like shape to extend to the upper side at other end portion thereof. Further, the board support portion 5 is provided with the board mounting portion 9 for supporting a lower face of the board 2 between the guide 7 and the hook 8.

The guide 7 includes the engaging portion 10 engaged with one side edge portion of the board 2 in a state of being mounted to the board mounting portion 9 at an upper portion thereof. The hook 8 includes the engaging portion 11 for engaging with other side end portion of the board 2 mounted to the board mounting portion 9. The hook 8 is provided with an elasticity, the raised portion 8a from the board support portion 5 is formed by a circular arc shape, there is not stress concentration at the raised portion 8a to constitute a constitution capable of being inclined easily.

Further, the guide 7 is formed with the inclined portion 12 an upper portion side of which is projected at a front end of the engaging portion 10 and the hook 8 is formed with the inclined portion 13 a lower portion side of which is projected at a front end of the engaging portion 11. Both of the inclined portions 12, 13 are provided with an object of being smoothly brought into contact with the board 2 without damaging the board 2 at portions thereof brought into contact with the board 2 in mounting the board 2.

The board 2 is provided with the first positioning grooves 14 by forming a plurality of pieces, for example, two pieces of notches at an end portion thereof on a side of being engaged with the guide 7 to engage with the positioning projected portion 15 provided at the board support portion 5. Further, the second positioning groove 16 is provided by forming a notch at an end portion of a portion of the board 2 engaged with the hook 8 to be engaged with the engaging portion 11 of the hook 8 provided at the board support portion 5.

Further, the board support portion 5 is formed with the positioning projection 17 extended to an upper side a front end of which is constituted by a conical shape or a curved face shape, and the board 2 is formed with the positioning hole 18 to which the positioning projection 17 is fitted to be inserted in correspondence with the positioning projection 17.

In such a constitution, when the board 2 is mounted to the board support 3, the mounting is carried out as follows.

First, a direction of the board 2 is constituted such that a side of the board 2 having the first positioning groove 14 is constituted by a side of the positioning projected portion 15 of the board support 3.

Under the state, by inclining the board 2, that is, by pressing the side of the first positioning groove 14 to a lower side, the board 2 is mounted onto the board mounting portion 9 of the board support portion 5.

Next, the board 2 is slid to a lower portion of the engaging portion 10 of the guide 7 such that the positioning projected portion 15 of the board support portion 5 is brought into the first positioning guide 14. At this occasions, the front end of the engaging portion 10 of the guide 7 is provided with the inclined portion 12 on the lower portion side. Therefore, the board 2 is brought into contact not with a corner portion but with the inclined face of the engaging portion 10 and the board 2 is not damaged.

Before the guide side end face of the board 2 is brought into contact with the deepest portion of the guide 7, the lower face of the end portion of the board 2 on the hook side is brought into contact with the inclined face of the engaging portion 11 of the hook 8. Under the state, the second positioning groove 16 of the board 2 and the hook 8 are positioned. The positioning hole 18 provided at the board 2 and the positioning projection 17 provided at the board support portion 5 are positioned. When the second positioning groove 16 of the board 2 and the hook 8 are positioned, and the positioning hole 18 of the board 2 and the positioning projection 17 of the board support portion 5 are positioned, a portion at a vicinity of the second positioning groove 16 of the board 2 is pressed to the lower side, the lower face of the board 2 is slid on the inclined face of the engaging portion 11 of the hook 8 to widen the hook 8 having an elasticity to an outer side, and the board 2 is mounted onto the board mounting portion 9 of the board support portion 5. Along therewith, the board 2 is engaged to the engaging portion 11 of the hook 8. When the board 2 is engaged with the engaging portion 11 of the hook 8, not only the board 2 is engaged with the engaging portion 11 of the hook 8, but also a face on an inner side of the raised portion 8a of the hook 8 having an elasticity presses the board 2 to the guide side, and the board 2 is fixed without rattle.

Thereby, the board 2 is accurately positioned to the board support 3 and is firmly supported and fixed thereby.

The board 2 is supported only by engaging the end portions of the board 2 to the engaging portions 10, 11 of the guide 7 and the hook 8 of the board support 3 to be mounted to the board mounting portion 9 without using a screw or the like as in the background art, and therefore, the board 2 is supported and fixed by the board support 3 extremely simply. Therefore, a number of integrating steps is reduced, also a number of members is reduced to reduce cost. Further, the board support 3 is constituted by a resin constituting an electric insulator, and therefore, an insulation distance may be shortened. Further, a space of operation of fastening a screw is dispensed with, and therefore, the board 2 may be designed to be downsized.

Further, the board support 3 is firmly engaged with the board 2 in an up and down and a left and right directions and fixed thereby, and therefore, earthquake-proof is promoted.

Further, the board 2 is positioned to the board support 3 without the positioning hole 18 of the board 2 and the positioning projection 17 of the board support portion, and therefore, the both are not necessarily needed.

INDUSTRIAL APPLICABILITY

The aspect of the invention can be utilized in a field of providing a control apparatus capable of simply supporting/fixing a board by a board support, reducing a number of integrating steps, reducing cost and downsizing a board size by being applied to a control apparatus of, for example, a serve amplifier, a servo drive, or an inverter apparatus of the like.

The invention claimed is:

1. A control apparatus constituted by attaching a board to a board support provided at a base attachably and detachably,
   wherein the board support is constituted by a resin and comprises:
   a guide having a section in an L-like shape provided to be extended to an upper side at one side end portion of the support member;
   an elastic hook having a section in an L-like shape provided to extend to the upper side at the other side end portion of the board support, the hook in which a portion of the hook raised from the board support is formed by a shape of a circular arc; and
   a board mounting portion provided between the guide and the hook for supporting a lower face of the board,
   wherein the guide includes an engaging portion provided at an upper portion of the guide and engaged with one side end portion of the board mounted to the board mounting portion,
   wherein the hook includes an engaging portion provided at an upper portion of the hook and engaged with the other side end portion of the board mounted to the board mounting portion, and the hook is provided with an elasticity and is able to inclined, and
   wherein when the hook engages with the other side end portion of the board, a face on an inner side of the raised portion of the hook presses the board to the guide side.

2. The control apparatus according to claim 1, wherein a front end of the engaging portion of the guide is formed with an inclined portion an upper portion side of which is projected, and a front end of the inclined portion of the hook is formed with an engaging portion a lower portion side of which is projected.

3. A control apparatus constituted by attaching aboard to a board support provided at a base attachably and detachably,
   wherein the board support is constituted by a resin and comprises:
   a guide having a section in an L-like shape provided to be extended to an upper side at one side end portion of the support member;
   an elastic hook having a section in an L-like shape provided to extend to the upper side at the other side end portion of the board support; and
   a board mounting portion provided between the guide and the hook for supporting a lower face of the board,
   wherein the guide includes an engaging portion provided at an upper portion of the guide and engaged with one side end portion of the board mounted to the board mounting portion,
   wherein the hook includes an engaging portion provided at an upper portion of the hook and engaged with the other side end portion of the board mounted to the board mounting portion, and the hook is provided with an elasticity and is able to inclined,
   wherein the board is provided with first positioning grooves by forming a plurality of notches at an end portion of the board on a side of being engaged with the guide, and the first positioning grooves are engaged with positioning projected portions provided at the board support portion, and
   wherein the board is provided with a second positioning groove by forming a notch at an end portion of a portion of the board engaged with the hook, and the second positioning groove is engaged with the engaging portion of the hook provided at the board support portion.

4. The control apparatus according to claim 1, wherein the board support is formed with a positioning projection extended to an upper side, and
   a positioning hole for fitting to insert the positioning projection is provided at a position of the board in correspondence with the positioning projection.

5. The control apparatus according to claim 4, wherein a front end of the positioning projection is formed by a conical shape or a curved face shape.

* * * * *